(12) United States Patent  
Fay

(10) Patent No.: US 11,652,283 B2  
(45) Date of Patent: May 16, 2023

(54) INTEGRATED ANTENNA USING THROUGH SILICON VIAS

(71) Applicant: Micron Technology, Inc., Boise, ID (US)

(72) Inventor: Owen R. Fay, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 107 days.

(21) Appl. No.: 17/392,015

(22) Filed: Aug. 2, 2021

(65) Prior Publication Data

US 2021/0367330 A1     Nov. 25, 2021

Related U.S. Application Data

(63) Continuation of application No. 16/134,315, filed on Sep. 18, 2018, now Pat. No. 11,081,783.

(51) Int. Cl.
| | |
|---|---|
| *H01Q 1/38* | (2006.01) |
| *H01L 21/768* | (2006.01) |
| *H01L 23/48* | (2006.01) |
| *H01L 23/525* | (2006.01) |

(52) U.S. Cl.
CPC ......... *H01Q 1/38* (2013.01); *H01L 21/76898* (2013.01); *H01L 23/481* (2013.01); *H01L 23/5256* (2013.01)

(58) Field of Classification Search
CPC .......... H01Q 1/38; H01Q 1/22; H01Q 1/2283; H01Q 21/00; H01Q 21/0093; H01Q 3/24; H01Q 3/247; H01L 21/768; H01L 21/76898; H01L 23/48; H01L 23/481; H01L 23/5256; H01L 23/522; H01L 23/5227

See application file for complete search history.

(56) References Cited

U.S. PATENT DOCUMENTS

| | | | |
|---|---|---|---|
| 7,843,064 B2 | 11/2010 | Kuo et al. | |
| 7,944,038 B2 | 5/2011 | Chiu et al. | |
| 8,736,050 B2 * | 5/2014 | Huang | H01L 24/13 |
| | | | 257/737 |
| 8,786,515 B2 | 7/2014 | Paradiso et al. | |
| 9,209,385 B2 | 12/2015 | Pagani | |
| 9,691,725 B2 * | 6/2017 | Chang | H01L 23/481 |
| 9,703,321 B2 | 7/2017 | Salmon | |
| 9,786,605 B1 | 10/2017 | Edelstein et al. | |
| 9,929,089 B2 | 3/2018 | Pagani | |
| 10,340,205 B2 | 7/2019 | Lin et al. | |
| 10,403,970 B2 | 9/2019 | Wang et al. | |
| 10,410,981 B2 | 9/2019 | Webb | |
| 11,018,098 B2 * | 5/2021 | Kaeding | H01Q 25/00 |

(Continued)

*Primary Examiner* — Tho G Phan

(74) *Attorney, Agent, or Firm* — Perkins Coie LLP

(57) ABSTRACT

Systems and methods of manufacture are disclosed for semiconductor device assemblies having a front side metallurgy portion, a substrate layer adjacent to the front side metallurgy portion, a plurality of through-silicon-vias (TSVs) in the substrate layer, metallic conductors located within at least a portion of the plurality of TSVs, and at least one conductive connection circuitry between the metallic conductors and the front side metallurgy portion. The plurality of TSVs with metallic conductors located within are configured to form an antenna structure. Selectively breakable connective circuitry is used to form and/or tune the antenna structure.

20 Claims, 5 Drawing Sheets

(56) References Cited

U.S. PATENT DOCUMENTS

| | | | |
|---|---|---|---|
| 2008/0023816 A1* | 1/2008 | Weng | H01L 23/3128 |
| | | | 257/E23.126 |
| 2009/0090541 A1 | 4/2009 | Chia | |
| 2009/0218407 A1 | 9/2009 | Rofougaran | |
| 2010/0164671 A1 | 7/2010 | Pagani et al. | |
| 2010/0297954 A1 | 11/2010 | Rofougaran et al. | |
| 2013/0009317 A1* | 1/2013 | Hsieh | H01L 23/481 |
| | | | 438/653 |
| 2013/0324041 A1 | 12/2013 | Pagani | |
| 2020/0043831 A1* | 2/2020 | Cheah | H01L 25/0657 |
| 2020/0091597 A1* | 3/2020 | Fay | H01L 23/5227 |

* cited by examiner

INTEGRATED ANTENNA USING THROUGH SILICON VIAS

CROSS-REFERENCE TO RELATED APPLICATION(S)

This application is a continuation of U.S. application Ser. No. 16/134,315, filed Sep. 18, 2018, which is incorporated herein by reference in its entirety.

TECHNICAL FIELD

The embodiments described herein relate to antennas, and, in particular, using through silicon vias (TSVs) to implement the antennas. The antenna may be a millimeter wave antenna.

BACKGROUND

As computing devices become more integrated into society, data access and mobility are becoming more important to a typical consumer. Compact wireless computing devices, such as cell phones, tablets, laptops, etc., are becoming faster, smaller, and more mobile. In order to meet the demands of new generation products, processing and memory packages within mobile devices must become faster and more compact. 5th Generation Wireless Systems (5G) provide high throughput, low latency, high mobility, and high connection density. Making use of millimeter wave bands (24-86 GHz) for mobile data communication is beneficial for producing 5G systems.

Antennas used for millimeter wave communication typically include an antenna array deposited on a printed circuit board (PCB) within a mobile device. The area, or real estate, to be occupied by an antenna decreases as the density of devices attached to the PCB and may result in larger, less mobile devices. Further, antennas used for millimeter wave communication typically include an antenna array that spans an area specific to the design of transmission circuitry to be used. As such, typical components (e.g., PCBs, integrated circuits, etc.) that incorporate antennas for millimeter wave communication may be specially produced to be compatible with a selected transmitter or application processor. In order to achieve compatibility with multiple processors, multiple antenna designs may be produced. This may add to the cost of production and may complicate incorporating millimeter wave antennas into multiple types and designs of mobile devices. These and other factors can make it difficult to incorporate millimeter wave antennas into mobile devices. Other issues, disadvantages, and drawbacks may exist.

Figure 1:
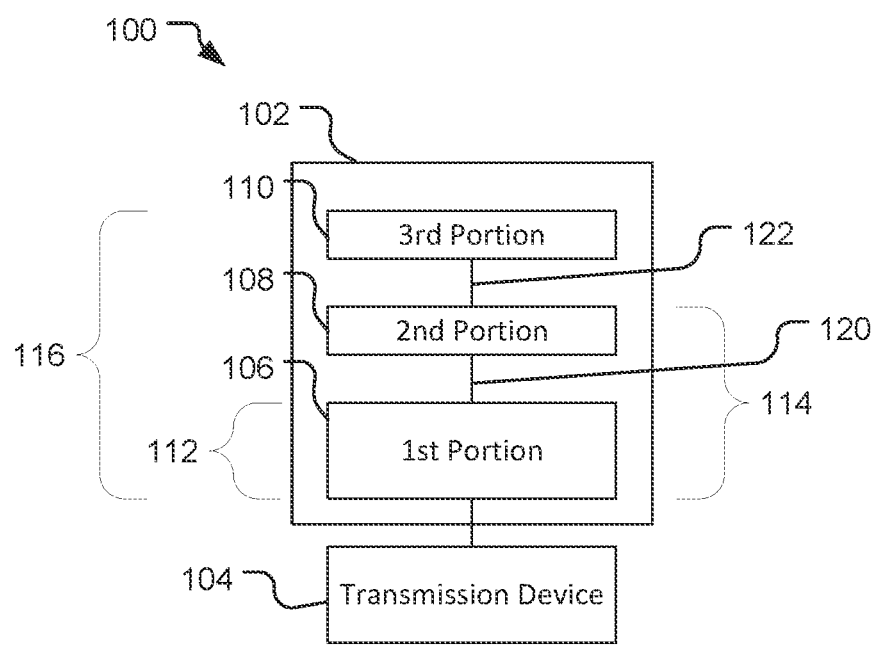
FIG. 1 is a block diagram schematic of a semiconductor device assembly incorporating integrated millimeter wave antennas in accordance with disclosed embodiments.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the spirit and scope of the invention as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods, in addition to those specific embodiments disclosed herein, may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may further include one or more device layers deposited on a substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporated within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, and methods of making and/or operating semiconductor devices. In one embodiment, a semiconductor device assembly includes a front side metallurgy portion, a substrate layer adjacent to the front side metallurgy portion, a plurality of through silicon vias (TSVs) in the substrate layer, metallic conductors located within at least a portion of the plurality of TSVs, and at least one conductive connection circuitry between the metallic conductors and the front side metallurgy portion.

In further disclosed embodiments, each of the plurality of TSVs is generally cylindrical in shape. In still further disclosed embodiments, the generally cylindrical shape has a diameter of substantially 2 microns to 30 microns and a depth of substantially 20 microns to 100 microns. In still further disclosed embodiments, the generally cylindrical shape has a diameter of substantially 8 microns and a depth of substantially 65 microns.

In further disclosed embodiments, the portion of the plurality of TSVs with metallic conductors located within are configured to form an antenna structure. In still further embodiments, the antenna structure covers an area of up to substantially 20 mm$^2$. In still further embodiments, the antenna structure covers an area of substantially 2 mm$^2$ to 6 mm$^2$.

In further disclosed embodiments, the semiconductor device assembly includes conductive connections between each of the metallic conductors located within at least a portion of the plurality of TSVs. In still further embodiments, the conductive connections between each of the metallic conductors located within at least a portion of the plurality of TSVs are selectively breakable connections. In still further embodiments, the selectively breakable connections are broken to tune the antenna structure.

Also disclosed are methods of making a semiconductor device assembly that include providing a front side metallurgy portion, providing a substrate layer adjacent to the front side metallurgy portion, providing a plurality of TSVs in the substrate layer, providing metallic conductors located within at least a portion of the plurality of TSVs, and providing at least one conductive connection between the metallic conductors and the front side metallurgy portion. Further disclosed embodiments include configuring the portion of the plurality of TSVs with metallic conductors located within to form an antenna structure.

Further disclosed embodiments include providing conductive connections between each of the metallic conductors located within at least a portion of the plurality of TSVs. In still further embodiments, the methods include providing selectively breakable connections as the conductive connections between each of the metallic conductors located within at least a portion of the plurality of TSVs. Still further disclosed embodiments include breaking selected ones of the selectively breakable connections to tune the antenna structure.

Referring to FIG. 1, a block diagram schematic of an embodiment of a semiconductor device assembly 100 is depicted. The semiconductor device assembly 100 may include a substrate 102. The substrate 102 may be a semiconductor substrate and, although not depicted in FIG. 1, may include additional devices formed thereon. For example, the substrate 102 may correspond to a memory chip configured to be coupled to another semiconductor device (e.g., in a package-on-package configuration or another type of stacked integrated circuit configuration). The substrate 102 may also correspond to other types of semiconductor devices.

A first portion 106, second portion 108, and third portion 110 of an antenna structure may be formed on the substrate 102. The first portion 106, second portion 108, and third portion 110 may be coupled together by electrical connection circuits 120, 122. The first portion 106 of the antenna structure may correspond to an antenna 112 that is compatible with a first type of transmission device. The first portion 106 and the second portion 108, when electrically coupled together by the electrical connection circuit 120, may correspond to an antenna 114 that is compatible with a second type of transmission device. The first portion 106, second portion 108, and third portion 110 of the antenna structure, when electrically coupled together by the electrical connection circuits 120, 122, may correspond to an antenna 116 that is compatible with a third type of transmission device.

The antenna structure made up by the portions 106, 108, 110 may be a millimeter wave antenna and may be usable for a 5G communications system. Further, the antenna structure may be integrated into a semiconductor device or a semiconductor package. Although FIG. 1 only depicts three portions 106, 108, 110 of the antenna structure, more or fewer than three portions may be formed on the substrate 102 and may be electrically coupled, as would be understood by persons of ordinary skill in the art having the benefit of this disclosure.

A transmission device 104 may be coupled to at least the first portion 106 of the antenna structure. The transmission device 104 may be compatible with an antenna having a particular area. In order to tune the antenna structure for use with the transmission device 104, one or more of the connections 120, 122 may be severed. For example, in some cases the electrical connection circuits 120, 122 may include fuses, or other circuit breakers, as described herein.

To illustrate, if the transmission device 104 is compatible with the antenna 112, then the electrical connection circuit 120 may be severed to make the antenna structure compatible with the transmission device 104. If the transmission device 104 is compatible with the antenna 114, then the electrical connection circuit 122 may be severed to make the antenna structure compatible with the transmission device 104. If the transmission device 104 is compatible with the antenna 116, then each of the electrical connection circuits 120, 122 may remain intact to make the antenna structure compatible with the transmission device 104.

The transmission device 104 may include radio communication circuitry, such as a transmitter, receiver, or a transceiver. Although not depicted in FIG. 1, the transmission device 104 may be included within a semiconductor device that may be coupled to the substrate 102 in a stacked semiconductor device assembly configuration (e.g., in a package-on-package configuration or another type of stacked integrated circuit configuration). For example, the transmission device 104 may be included in a semiconductor package that includes a processor (e.g., an applications processor, a digital signal processor, a central processing unit, etc.). The portions 106, 108, 110 of the antenna structure may be included in another semiconductor package that includes a memory module. The memory may be stacked with the processor to form a package-on-package assembly, or another type of stacked integrated circuit.

A benefit of the semiconductor device assembly 100 is that an antenna structure may be tuned depending on a particular type of transmission device 104 to be used with it. This may enable a single design for a particular device (e.g., a semiconductor package) to be manufactured and used with multiple different designs for a transmission device 104. As such, the costs of manufacturing the substrate 102 including the portions 106, 108, 110 of the antenna structure may be reduced by not customizing each design for a contemplated transmission device 104. Other advantages may exist.

Figure 2:
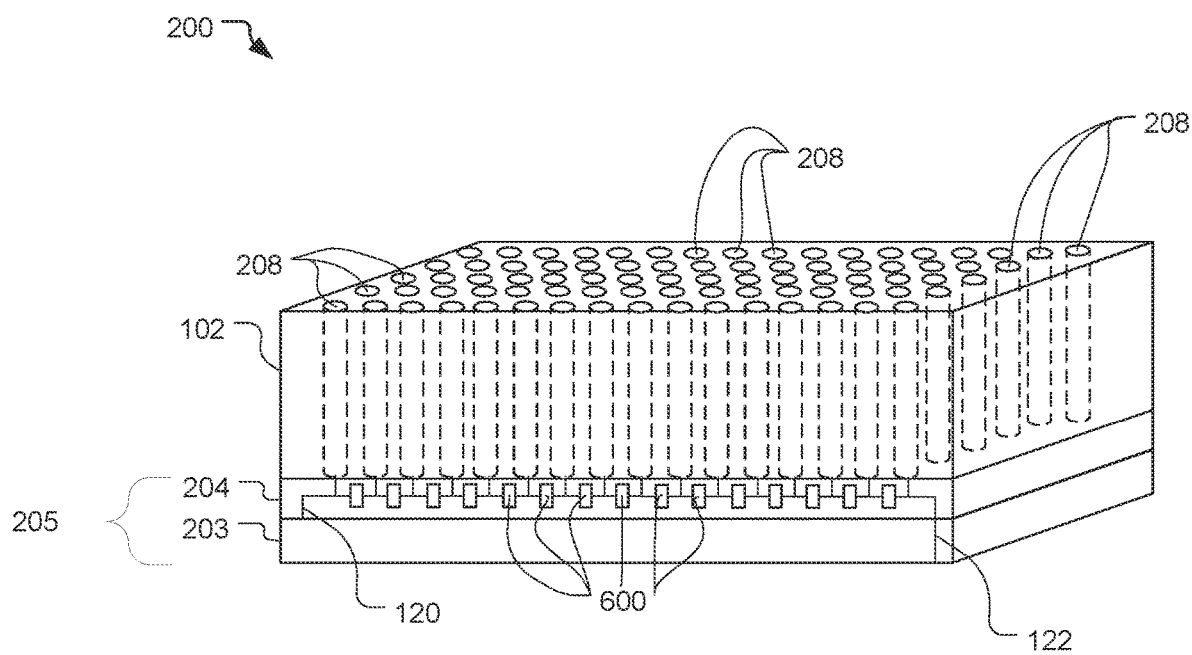
FIG. 2 is a schematic perspective view of a semiconductor device assembly in accordance with disclosed embodiments.

FIG. 2 is a schematic perspective view of a semiconductor device assembly 200 in accordance with disclosed embodiments. As shown, semiconductor device assembly 200 may include one or more device layers 203, 204 formed on one side of a substrate 102. The one or more device layers 203, 204 may correspond to processors, or other integrated circuits, memory, or the like. The one or more device layers 203, 204 constitute the front side metallurgy portion 205. The opposite (e.g., back) side of the front side metallurgy portion 205 is substrate 102 (e.g., silicon). A plurality of TSVs 208 are included in the substrate 102. As a person of ordinary skill in the art would comprehend having the benefit of this disclosure, any number of TSVs 208, in any arrangement, and of any shape, may be used.

In accordance with disclosed embodiments, the TSVs 208 are filled with an appropriate conductive material (e.g., Cu or the like). As indicated schematically in FIG. 2, each individual TSV 208 is connected to each other TSV 208 through an electrical connection circuit 600. For clarity, only an exemplary first row of connection circuits 600 is shown in FIG. 2. Further, the location of connection circuits 600 in device layer 204 is merely exemplary and connection circuits 600 may be located in a separate layer, across multiple layers, within the substrate layer 102, in a distribution layer, or other suitable locations. Additionally, one or more electrical connection circuits 120, 122 between the TSVs 208 and front side metallurgy portion 205 may be provided as indicated schematically on FIG. 2. As a person of ordinary skill in the art would comprehend having the benefit of this disclosure, any number of electrical connection circuits 120, 122, in any arrangement, may be used. As would also be appreciated by a person of ordinary skill in the art having the benefit of this disclosure, the TSVs 208 that are filled with a conductive material and appropriately connected to one another and to the front side metallurgy portion 205 form antenna structures as disclosed herein.

Figure 3:
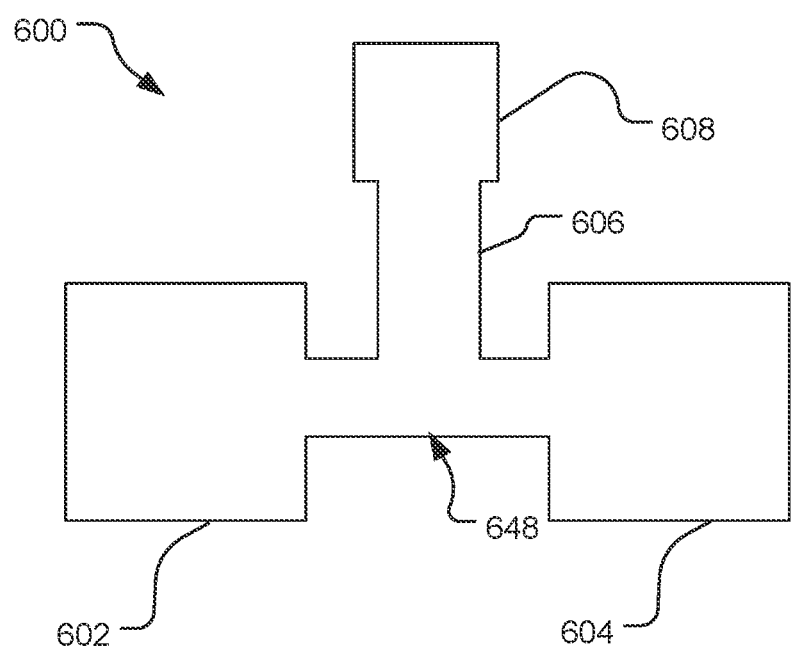
FIG. 3 is a schematic illustration of an electrical connection circuit with a fuse in accordance with disclosed embodiments.

Referring to FIG. 3, an embodiment of an electrical connection circuit 600 with a fuse 648 is depicted. The electrical connection circuit 600 may correspond to the electrical connection circuits 120, 122 and may be used with the semiconductor device assemblies 100, 200.

The electrical connection circuit 600 may include a first electrode 602 and a second electrode 604 connected by a fuse 648. Each of the first electrode 602 and the second electrode 604 may be configured to be electrically coupled to a corresponding portion of an antenna, such as the portions 106, 108, 110. The electrical connection circuit 600 may further include a pin 608 and a connector 606. By applying a current to the pin 608, the fuse 648 may be blown and the first electrode 602 may be disconnected from the second electrode 604. The connector 606 may be robust enough to limit breakdown only to the fuse 648, thereby ensuring that an electrical connection between the first electrode 602 and the second electrode 604 is severed.

Blowing the fuse 648 may enable an antenna structure to be shortened as described herein, thereby decreasing an area associated with the antenna structure. Different types of radio circuitry may require antennas of different sizes. By including the fuse 648, the antenna structure may be tuned for a particular application.

Figure 4:
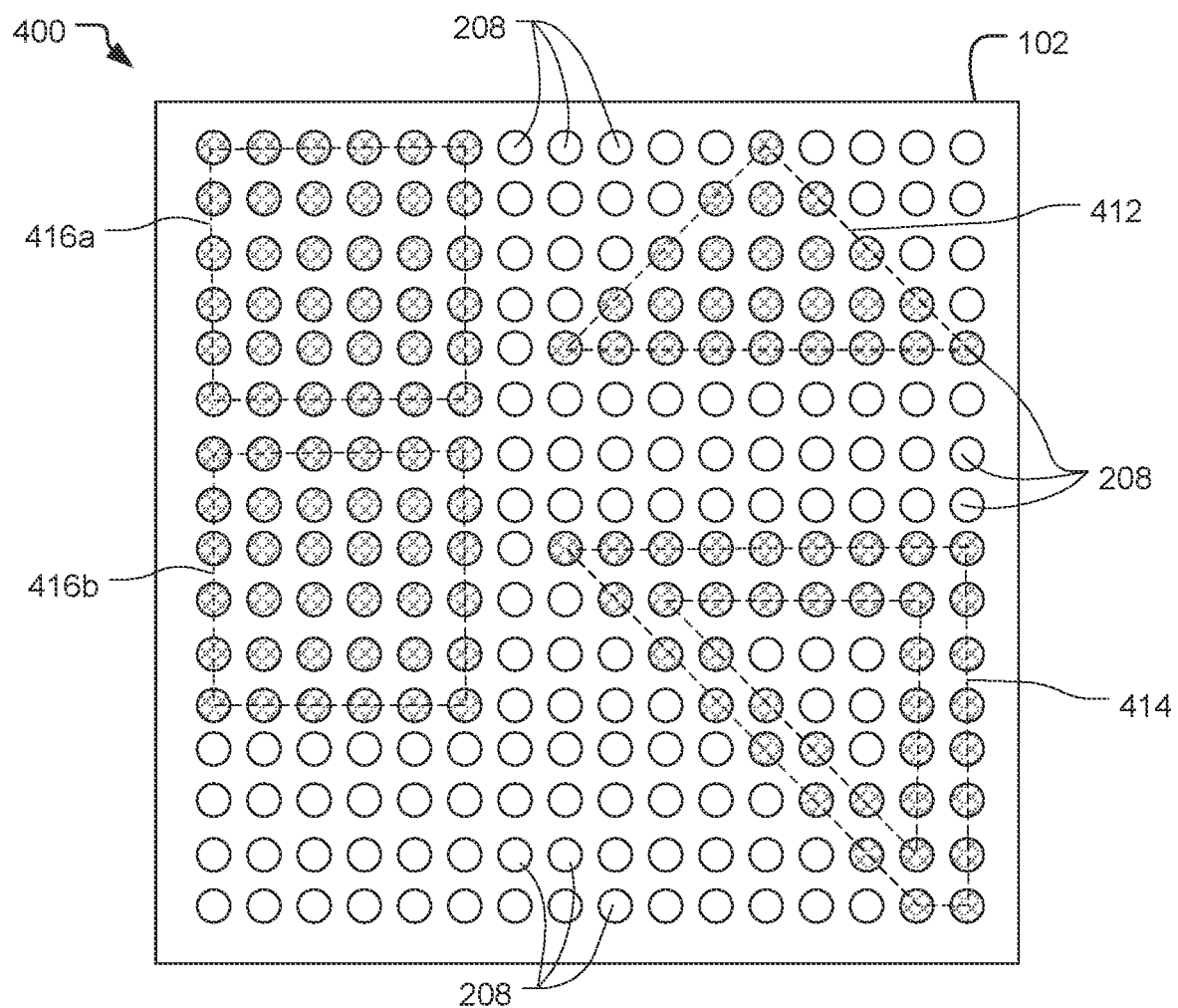
FIG. 4 is a top view schematic of a semiconductor device assembly incorporating integrated millimeter wave antennas formed by connection of conductor-filled TSVs.

FIG. 4 is a top view schematic of a semiconductor device assembly 400 incorporating integrated millimeter wave antennas 412, 414, 416a, and 416b formed by connection of conductor-filled TSVs 208. As shown, the millimeter wave antennas 412, 414, 416a, and 416b may comprise any suitable shape, size, configuration, or the like, in accordance with the design of the device.

As explained herein, an antenna structure 412, 414, 416a, and 416b may be tuned for a particular transmission device 104, or radio circuitry, by any number of suitable methods. For example, different types of radio circuitry may require antennas of different sizes or shapes. By including an antenna structure such as 416a and 416b, with a separate electrical connection circuit 600 to each conductor filled TSV 208 to create portions 416a and 416b the size of the antenna may be changed (e.g., lengthened by connecting both sections 416a and 416b to the same circuitry, or shortened by connecting only one section) and the antenna may be tuned to the desired outcome. Likewise, by connecting multiple antenna structures (e.g., 412 and 414) to the same circuitry a different shape of antenna may be implemented. As a person of ordinary skill in the art would comprehend having the benefit of this disclosure, any number of TSVs 208, in any arrangement, and of any shape, may be used to form antennas (e.g., 412, 414) of any shape, size, or frequency response. In some embodiments, TSVs 208 may be substantially cylindrical in shape approximately 2 microns to 30 microns in diameter and 20 microns to 100 microns in depth. In one preferred embodiment, TSV 208 may be substantially 8 microns in diameter and 65 microns in depth. The TSVs 208 may cover an area up to substantially 20 mm$^2$. In one preferred embodiment, approximately five-thousand TSVs 208 may be placed in substrate 102 and cover a surface area of substantially 2 mm$^2$ to 6 mm$^2$. Other configurations are also possible.

As disclosed herein, selective connection of the conductor filled TSVs 208 may be accomplished by severing fuses 648 in the connection circuitry 600 for the TSVs 208 that are not to be included in the antenna structure (exemplary connections for TSVs 208 indicated by cross-hatching in FIG. 4). Switches in the connection circuitry 600, alterations of the circuitry 600, or the like, may also be used to selectively connect TSVs to form antenna structures.

Figure 5:
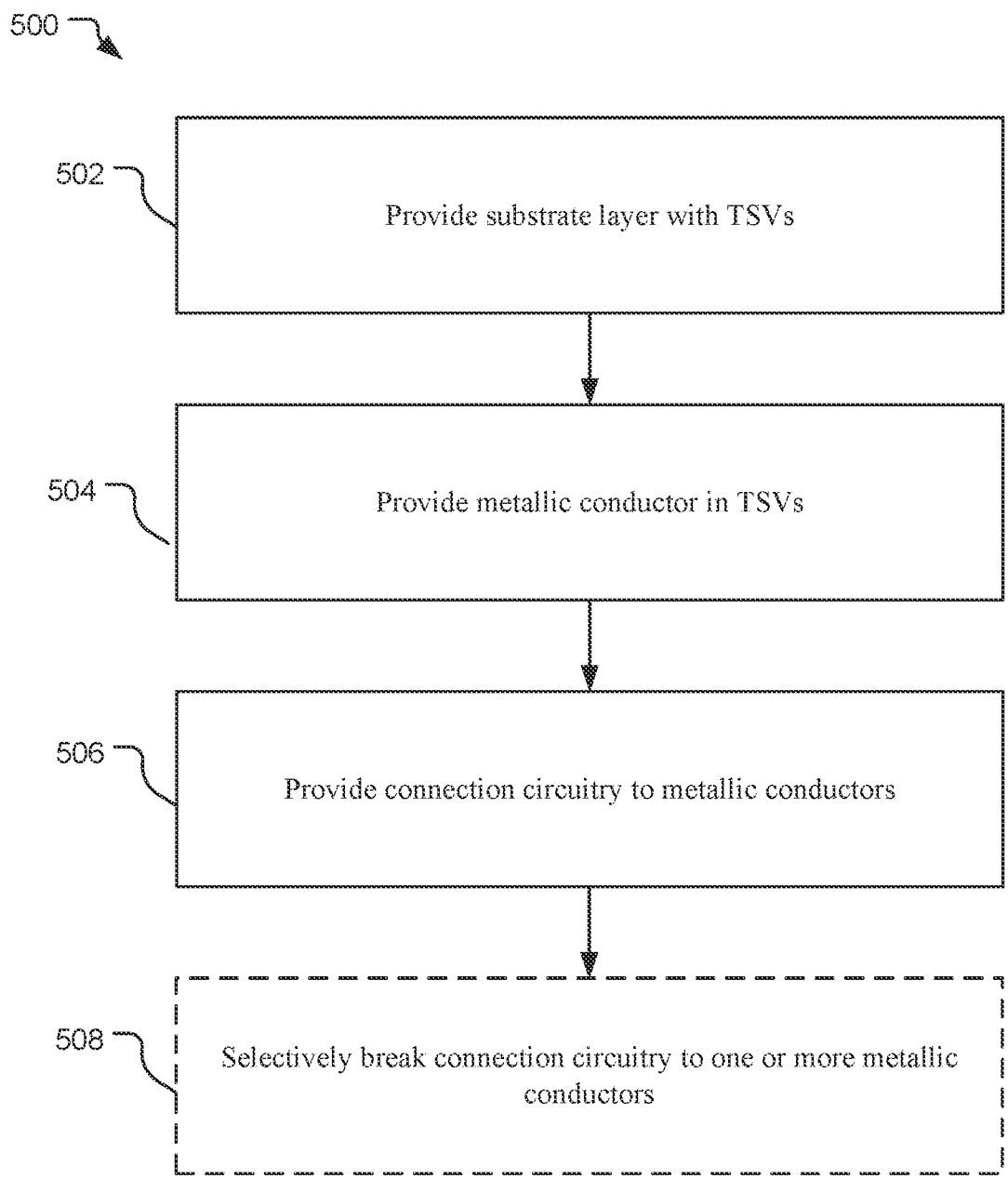
FIG. 5 is a flow chart showing an exemplary method of manufacturing a semiconductor device assembly incorporating integrated millimeter wave antennas in accordance with disclosed embodiments.

FIG. 5 is a flow chart showing an exemplary method 500 of manufacturing a semiconductor device assembly 100, 200 incorporating integrated millimeter wave antennas 112, 114, 116, 412, 414, 416a, 416b in accordance with disclosed embodiments. As shown, method 500 may include at 502 providing a substrate layer (e.g., 102) with one or more TSVs 208. At 504 one or more metallic conductors may be provided in the one or more TSVs 208. As one of ordinary skill in the art would understand having the benefit of this disclosure, the metallic conductors may be provided simultaneously with (i.e., during) the formation of the substrate layer 102. At 506 connection circuitry (e.g., 600) is provided to the metallic conductors in the TSVs 208. At 508 the one or more antenna structures (e.g., 112, 114, 116, 412, 414, 416a, 416b) may be formed by selectively breaking the connection circuitry 600 using a fuse 648 or the like as disclosed herein. Step 508 is indicated in dashed lines as an optional step depending upon the particular semiconductor device assembly 100, 200 being manufactured. For example, if the antenna structure (e.g., 112, 114, 116, 412, 414, 416a, 416b) is of a predetermined shape, size, and frequency response, it may be formed during steps 502 and 504 as the substrate 102 and TSVs 208 are being created and filled with metallic conductors. Alternatively, a "generic" layout of TSVs 208 may be provided (e.g., as in FIG. 4) and then afterwards an antenna structure may be formed and customized by selective connection/breaking of the connection circuitry 600 as disclosed herein. As one of ordinary skill in the art having the benefit of this disclosure would also understand, the steps of method 500 may be executed in a different order, at different times, or steps added or removed in accordance with the various types of semiconductor device assemblies 100, 200 as disclosed herein.

Although various embodiments have been shown and described, the present disclosure is not so limited and will be understood to include all such modifications and variations as would be apparent to one skilled in the art.

I claim:

1. A semiconductor device comprising:
   a semiconductor substrate having a front side and a back side;
   one or more device layers at the front side of the semiconductor substrate;
   a plurality of through-silicon-vias (TSVs) extending at least partially through the semiconductor substrate; and
   an antenna structure including a subset of the plurality of TSVs and a connector electrically coupling the subset to the one or more device layers.

2. The semiconductor device of claim 1, wherein:
   the connector includes a first electrode coupled to a second electrode by a selectably breakable connection,
   the first electrode is electrically coupled to a first portion of the plurality of TSVs,
   the second electrode is electrically coupled to a second portion of the plurality of TSVs, and
   the subset is the first portion and/or the second portion.

3. The semiconductor device of claim 2, wherein the selectably breakable connection is a fuse.

4. The semiconductor device of claim 1, wherein:
   the connector includes a first electrode coupled to the one or more device layers by a first selectably connectable connection and a second electrode coupled to the one or more device layers by a second selectably connectable connection,
   the first electrode is electrically coupled to a first portion of the plurality of TSVs,
   the second electrode is electrically coupled to a second portion of the plurality of TSVs, and
   the subset is the first portion and/or the second portion.

5. The semiconductor device of claim 1, wherein the connector is disposed in the one or more device layers.

6. The semiconductor device of claim 1, wherein the connector is disposed in or adjacent the semiconductor substrate.

7. The semiconductor device of claim 1, wherein the connector is disposed in a distribution layer separate from the one or more device layers.

8. The semiconductor device of claim 1, wherein the antenna structure is a millimeter wave antenna.

9. The semiconductor device of claim 1, wherein the plurality of TSVs extend completely through the semiconductor substrate.

10. The semiconductor device of claim 1, wherein the antenna structure is a first antenna structure, the subset is a first subset, and the connector is a first connector, further comprising a second antenna structure including a second subset of the plurality of TSVs and a second connector electrically coupling the second subset to the one or more device layers.

11. A method of making a semiconductor device comprising:
    providing a semiconductor substrate having a front side, a back side, and one or more device layers at the front side;
    forming a plurality of through-silicon-vias (TSVs) extending at least partially through the semiconductor substrate; and
    configuring an antenna structure by selectably connecting a subset of the plurality of TSVs to the one or more device layers with a configurable connector.

12. The method of claim 11, wherein:
    the configurable connector includes a first electrode coupled to a second electrode by a selectably breakable connection,
    the first electrode is electrically coupled to a first portion of the plurality of TSVs,
    the second electrode is electrically coupled to a second portion of the plurality of TSVs, and
    configuring the antenna structure comprises breaking the selectably breakable connection.

13. The method of claim 12, wherein the selectably breakable connection is a fuse.

14. The method of claim 11, wherein:
    the configurable connector includes a first electrode coupled to the one or more device layers by a first selectably connectable connection and a second electrode coupled to the one or more device layers by a second selectably connectable connection,
    the first electrode is electrically coupled to a first portion of the plurality of TSVs,
    the second electrode is electrically coupled to a second portion of the plurality of TSVs, and
    configuring the antenna structure comprises selectably connecting one or both of the first selectably connectable connection and the second selectaably connectable connection.

15. The method of claim 11, wherein the configurable connector is disposed in the one or more device layers.

16. The method of claim 11, wherein the configurable connector is disposed in or adjacent the semiconductor substrate.

17. The method of claim 11, wherein the configurable connector is disposed in a distribution layer separate from the one or more device layers.

18. The method of claim 11, wherein the antenna structure is a millimeter wave antenna.

19. The method of claim 11, wherein the antenna structure is a first antenna structure, the subset is a first subset, and the configurable connector is a first configurable connector, further comprising configuring a second antenna structure by selectably connecting a second subset of the plurality of TSVs to the one or more device layers with a second configurable connector.

20. A semiconductor device assembly comprising:
    a first semiconductor device, including:
       a semiconductor substrate having a front side and a back side,
       one or more device layers at the front side of the semiconductor substrate,
       a plurality of through-silicon-vias (TSVs) extending at least partially through the semiconductor substrate, and
       an antenna structure including a subset of the plurality of TSVs and a connector electrically coupling the subset to the one or more device layers, and
    a second semiconductor device, including:
       a transmission device operably coupled to the antenna structure in the first semiconductor device; and
       a processor operably coupled to the transmission device.

* * * * *